United States Patent [19]

Uragami

[11] Patent Number: 4,645,951
[45] Date of Patent: Feb. 24, 1987

[54] SEMICONDUCTOR INTEGRATED CIRCUIT HAVING A C-MOS INTERNAL LOGIC BLOCK AND AN OUTPUT BUFFER FOR PROVIDING ECL LEVEL SIGNALS

[75] Inventor: Akira Uragami, Takasaki, Japan

[73] Assignee: Hitachi, Ltd., Tokyo, Japan

[21] Appl. No.: 646,110

[22] Filed: Aug. 31, 1984

[30] Foreign Application Priority Data

Aug. 31, 1983 [JP] Japan .................. 58-157817
Aug. 31, 1983 [JP] Japan .................. 58-157818
Aug. 31, 1983 [JP] Japan .................. 58-157819

[51] Int. Cl.$^4$ .................. H03K 17/12; H03K 19/01
[52] U.S. Cl. .................. 307/446; 307/443; 307/451; 307/455; 307/475; 307/497
[58] Field of Search .......... 307/443, 446, 451, 455, 307/475, 495, 496–497, 570

[56] References Cited

U.S. PATENT DOCUMENTS

| | | | |
|---|---|---|---|
| 4,366,397 | 12/1982 | Kitamura et al. | 307/446 X |
| 4,450,371 | 5/1984 | Bismarck | 307/475 |
| 4,453,095 | 6/1984 | Wrathall | 307/475 |
| 4,472,647 | 9/1984 | Allgood et al. | 307/475 |
| 4,491,743 | 1/1985 | Smith | 307/475 X |
| 4,527,079 | 7/1985 | Thompson | 307/475 |
| 4,563,601 | 1/1986 | Asano et al. | 307/475 |

FOREIGN PATENT DOCUMENTS 0101226 8/1979 Japan .................. 307/475

OTHER PUBLICATIONS

Clemen et al, "V$_T$-Compensated TTL-Compatible MOS Amplifier", *IBM T.D.B.*, vol. 21, No. 7, 12-1978, pp. 2874–2875.

Primary Examiner—Stanley D. Miller
Assistant Examiner—D. R. Hudspeth
Attorney, Agent, or Firm—Antonelli, Terry & Wands

[57] ABSTRACT

A semiconductor integrated circuit is provided which combines an MOS internal logic circuit (C-MOS in the preferred embodiment) with input and output buffers which have pin-compatibility with ECL circuitry. An ECL-CMOS level-conversion input buffer circuit arranged for a C-MOS internal logic circuit has a pair of emitter-coupled transistors which are responsive to an input signal at an ECL level. Thus, the input buffer circuit operates at a high speed. A CMOS-ECL level-conversion output buffer circuit arranged for the C-MOS internal logic circuit has an amplifying transistor, which has its base responsive to the output signal of the C-MOS internal logic circuit, and an emitter-follower transistor which has its base responsive to the collector signal of said amplifying transistor for generating an output signal at an ECL level at its emitter. Thus, the output buffer circuit operates at a high speed. Utilizing such an arrangement, the circuit can obtain the benefits of lower power consumption for the C-MOS internal logic circuit together with high speed in the buffer stages and ECL compatibility.

14 Claims, 15 Drawing Figures

SEMICONDUCTOR INTEGRATED CIRCUIT HAVING A C-MOS INTERNAL LOGIC BLOCK AND AN OUTPUT BUFFER FOR PROVIDING ECL LEVEL SIGNALS

BACKGROUND OF THE INVENTION

1. Field of the Invention

The present invention relates to a semiconductor technique and, more particularly, to a technique which is especially effective when it is applied to a semiconductor integrated circuit for example, a technique which is effective when it is used in a semiconductor integrated circuit having its logic circuit composed of MIS (i.e., metal-insulator-semiconductor) elements.

2. Description of the Prior Art

Emitter-coupled logic circuits (which will hereinafter be called "ECL") are known to have the highest operating speed of all digital integrated circuits fabricated by present silicon semiconductor techniques. However, it is well known in the art that ECL circuits have a defect that their power consumption is high. A ground potential as a first power source voltage and a negative voltage (at about −5 V) as a second power source voltage are supplied to the ECL, and a digital input signal voltage having a high level beyond about −0.9 V and a low level below about −1.7 V is applied to the input terminal of the ECL so that a digital output signal voltage having a high level beyond about −0.9 V and a low level below about −1.7 V is obtained from the output terminal of the ECL. In the ECL, there are arranged a first transistor and a second transistor which have their emitters coupled, and a digital input signal voltage as above is applied to the base of the first transistor through an input terminal. A reference voltage circuit for generating a reference voltage at about −1.2 V, i.e., at an intermediate level between −0.9 V and −1.7 V is arranged in the ECL circuit, and the reference voltage is about −1.2 V is applied to the base of the second transistor. The collector of at least one of the first and second transistors is connected with a group potential through a load resistor so that the signal generated at the laod resistor is transmitted as a digital output signal voltage to the output terminal of the ECL through an emitter follower transistor.

On the other hand, a complmentary MOS (which will hereinafter be called "C-MOS") circuit, in which P-channel and N-channel MIS field effect transistors are combined, can ignore the DC current flowing through the series path of the two transistors because of the transistors is turned off when the other is turned on. Therefore, the C-MOS circuit has an advantage that its power consumption is remarkably low. Unfortunately, the C-MOS circuit has a defect that its operating speed is dependent upon the capacity of a load which is connected to the output thereof. However, the delay of the operating speed of the C-MOS can be sufficiently reduced either by having the output of the C-MOS drive a load capacitor which is formed in an integrated circuit and which has a small capacitance or by driving the load capacitor by the output of the C-MOS through a bipolar transistor.

In order to develop a novel semiconductor integrated circuit which has such signal level characteristics at its input and output terminals which are equivalent to those of the ECL and which reduces its power consumption by making use of the C-MOS, the present inventor has investigated the technique which will be described below. This novel semiconductor integrated circuit also has an advantage that, when it is to be coupled with another ECL, it is unnecessary to arrange any ECL-CMOS level conversion semiconductor integrated circuit in the coupling path.

Figure 1:
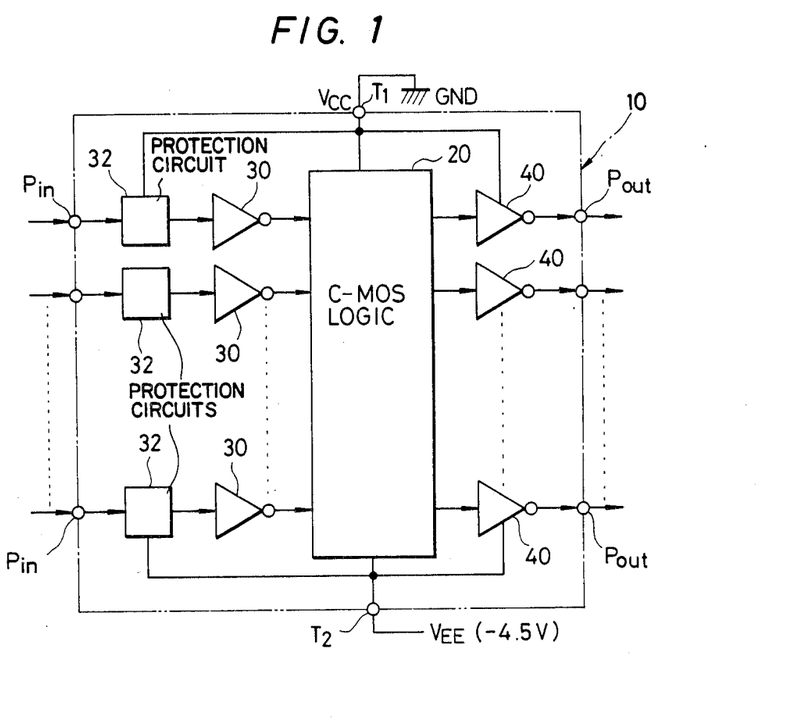
FIG. 1 is a block diagram showing one example of C-MOS type logic semiconductor integrated circuits which had been investigated by the inventor prior to the present invention.
Figure 2:
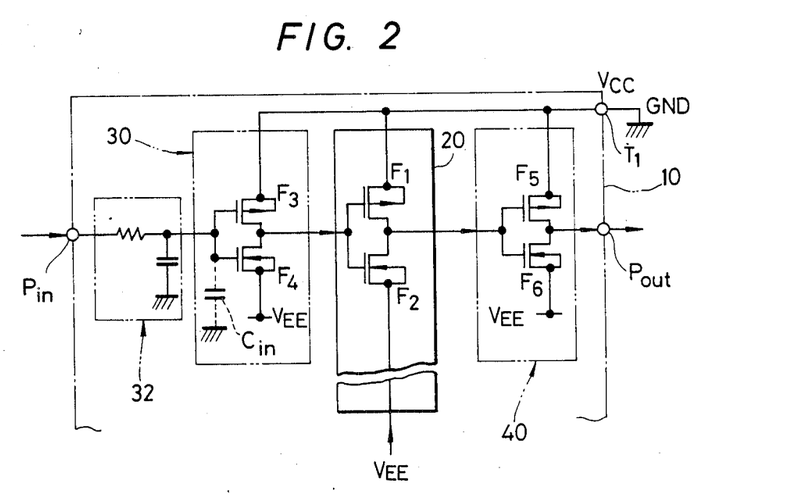
FIG. 2 is a circuit diagram showing one portion of FIG. 1 in an enlarged scale.

FIGS. 1 and 2 show an example of C-MOS type semiconductor integrated circuits which have been examined by the present inventor prior to developing the preferred embodiments of the present invention on the basis of the background described above. A ground potential (GND) is supplied as a first power source voltage $V_{CC}$ to a terminal $T_1$, and a negative voltage (at about −4.5 V) is supplied as a second power source voltage $V_{EE}$ to a terminal $T_2$. The integrated circuit has its input terminal $P_{in}$ receptive of a digital input signal voltage at the ECL level so that it generates a digital output signal voltage at the ECL level at its output terminals $P_{out}$. The semiconductor integrated circuit generally indicated at numeral 10 in FIGS. 1 and 2 is constructed of an internal logic circuit 20 and peripheral buffer circuits 30 and 40. Each of the circuits 20, 30 and 40 is composed of MOS type elements such as C-MOS field effect transistors.

Although not shown in FIGS. 1 and 2, the internal logic circuit 20 actually includes a number of C-MOS inverters, C-MOS NAND circuits, C-MOS NOR circuits, C-MOS flip-flops and so on so as to execute large-scale digital signal processing. Such C-MOS circuitry for logic operations are well known and a large number of logic operations can be readily performed by the circuit 20 using well-known design arrangements.

The peripheral buffer circuits 30 and 40 are exemplified by input buffer circuits 30 and output buffer circuits 40. The internal logic circuit 20 is connected through those buffer circuits 30 and 40 with the input terminal pad $P_{in}$ and the output terminal pad $P_{out}$. The elements to be used to compose the peripheral buffer circuits 30 and 40 are MOS type elements which have sufficiently higher current capacities than those of the elements composing the internal logic circuit 20 to handle the larger current flows which occur in the buffers. As a result, the MOS type elements forming buffers 30 and 40 must be formed to have sufficiently large sizes. Instead of this, the elements composing the internal logic circuit are very small-sized so that a high integration density can be obtained.

The C-MOS type semiconductor integrated circuit of this kind consumes so little electric power that it liberates little heat. For these reasons, it is relatively easy to increase the integration density of the C-MOS type semiconductor integrated circuit of this kind. However, the inventor's studies revealed a problem with this arrangement, which will now be discussed.

Specifically, the input signal at the ECL level (which has a high level $V_{iH}$ of −0.9 V and a low level $V_{iL}$ of −1.7 V) is supplied to the input terminals $P_{in}$ so that the output signal at the ECL level (which has a high level $V_{oH}$ of −0.9 V and a low level $V_{oL}$ of −1.7 V) is extracted from the output terminals $P_{out}$, and the negative power source voltage $V_{EE}$ of −4.5 V is supplied. In order to form a P-channel MOSFET F1 and an N-channel MOSFET F2 composing the internal logic circuit 20 with element areas as small as possible, it is necessary to make the ratio W/L of the width W to the length L of each channel common between the two MOSFETs F1 and F2. As a result, the logic threshold of the C-MOS inverter composed of the MOSFETs F1 and F2 is about one half ($-2.25$ V) of the negative power source voltage $V_{EE}$.

As a result of the above requirements for the MOSFETs F1 and F2, each input buffer circuit 30 has to supply the internal logic circuit 20 with the input signal of the input terminal $P_{in}$ after its level has been converted, and the ratio W/L of MOSFETs F3 and F4 has to be increased to a large value for that level conversion. Considering the fanout, moreover, the output driving capacity of the input buffer circuit 30 also has to be improved. Because of this, the ON resistance $R_{ON}$ of the MOSFETs F3 and F4 has to be reduced to a sufficiently small value. As a result, the input buffer circuit 30 will occupy a large area in the surface of the semiconductor chip.

On the other hand, it is necessary that the output voltage of each output buffer circuit 40 be equal to or higher than the predetermined high level $V_{oH}$ ($-0.9$ V) when an output current at a predetermined level is supplied from the output terminal $P_{out}$ whereas the output voltage of the output buffer circuit 40 has to be equal to or lower than the predetermined low level $V_{oL}$ ($-1.7$ V) when an output current at a predetermined level is introduced from the output terminal $P_{out}$. Also, it is desired that the operating speed concerning the waveform changes of the digital output signal is prevented from changing to a large extent in dependence upon the capacitance value of an external load capacitor connected with the output terminal $P_{out}$. Therefore, it is necessary that the ON resistance $R_{On}$ of MOSFETs F5 and F6 composing the output buffer circuit 40 be set at a small value, and that the ratio W/L of the MOSFETs F5 and F6 be set at a large value. As a result, the output buffer circuit 40 also occupies a large area in the surface of the semiconductor chip.

In addition to the above problems regarding buffers 30 and 40, the gate insulating films of the C-MOS field effect transistors are liable to be broken electrostatically or by a surge voltage. As a result, in the C-MOS type semiconductor integrated circuit of FIGS. 1 and 2, it is indispensable to connect input protection circuits 32 between the peripheral buffer circuits, especially, the input buffer circuits 30 and the input terminal pad $P_{in}$, as shown in FIGS. 1 and 2. However, each protection circuit 32 occupies a considerable layout area for its formation, and its RC time constant adversely affects the rise or fall of the input logic signal to cause a delay of the operating speed.

SUMMARY OF THE INVENTION

It is, therefore, a first object of the present invention to provide a semiconductor integrated circuit technique for enabling a main part of an internal logic circuit to be composed of C-MOS circuits and an input buffer circuit receptive of an input at an ECL level for feeding a level-converted output to the internal logic circuit to be formed with a small occupied area.

A second object of the present invention is to provide a semiconductor integrated circuit technique for enabling a main part of an internal logic circuit to be composed of C-MOS circuits and an output buffer circuit for converting the output signal of the internal logic circuit into an output signal at an ECL level to be formed with a small occupied area.

A third object of the present invention is to provide a semiconductor integrated circuit technique for enabling a main part of an internal logic circuit to be composed of a C-MOS circuit and both an input buffer circuit receptive of an input at an ECL level for feeding a level-converted output to the internal logic circuit and an output buffer circuit for converting the output signal of the internal logic circuit into an output signal at an ECL level to be formed with small occupied areas.

These and other objects and novel features of the present invention will become apparent from the description of the specification and the accompanying drawings.

Representative examples of the invention to be disclosed hereinbelow are briefly summarized in the following.

The purpose of allowing the semiconductor integrated circuit of the present invention to have the advantages of both C-MOS circuits and ECL or bipolar transistors can be achieved by composing a main part of the internal logic circuit of the C-MOS circuits and by composing the peripheral buffer circuits of ECL or bipolar circuits.

DESCRIPTION OF THE PREFERRED EMBODIMENTS

The present invention will be described in the following in connection with representative embodiments thereof with reference to the accompanying drawings.

Incidentally, the identical or corresponding portions are indicated at identical reference characters in the drawings.

Figure 3:
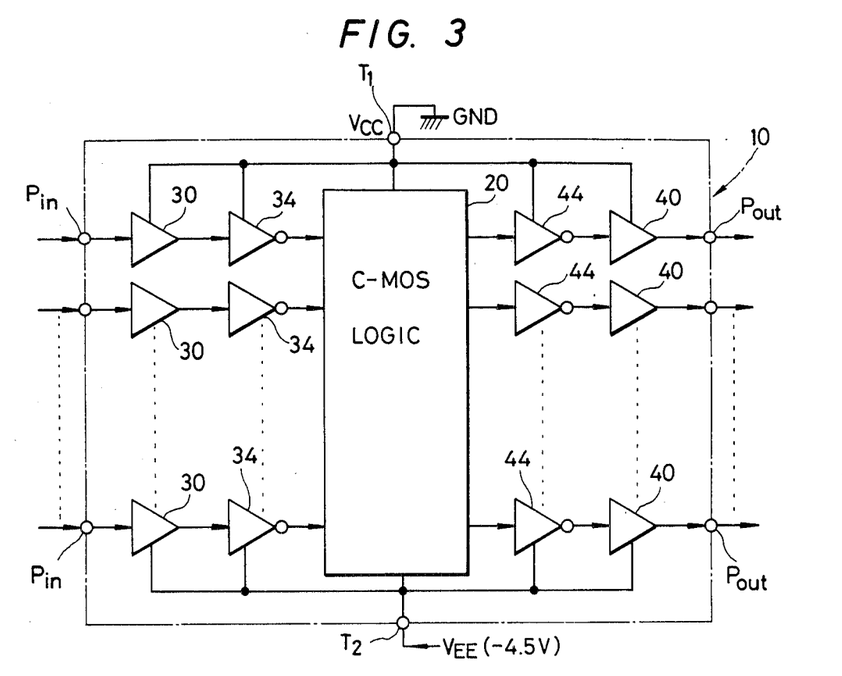
FIG. 3 is a block diagram showing one embodiment of the logic semiconductor integrated circuit according to the present invention.
Figure 4:
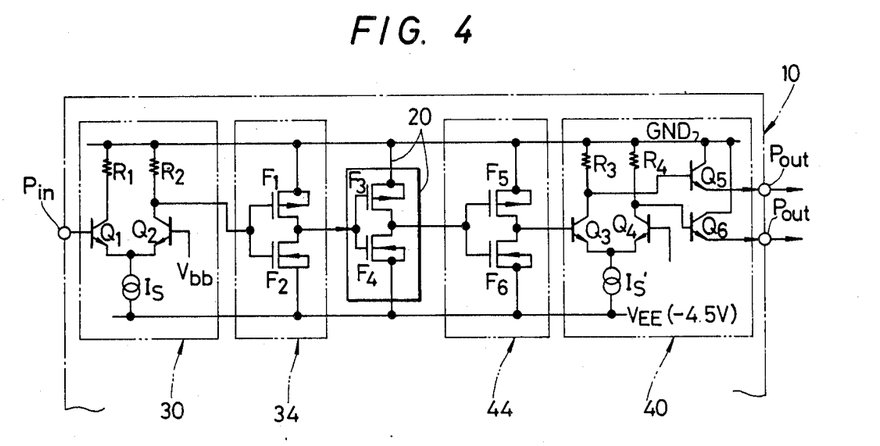
FIG. 4 is a circuit diagram showing one portion of FIG. 3 in an enlarged scale.

FIGS. 3 and 4 show one embodiment of the semiconductor integrated circuit according to the present invention.

A ground potential (GND) is supplied as a first power source voltage $V_{CC}$ to a terminal $T_1$, and a negative voltage (about $-4.5$ V) is supplied as a second power source voltage $V_{EE}$ to a terminal $T_2$. A digital input signal voltage at the ECL level is applied to input terminals $P_{in}$ of the integrated circuit so that a digital output signal voltage at the ECL level is obtained from output terminals $P_{out}$.

A semiconductor integrated circuit indicated generally at numeral 10 in FIGS. 3 and 4 is provided with an internal logic circuit 20 and peripheral buffer circuits 30 and 40. These peripheral buffer circuits 30 and 40 are exemplified by the input buffer circuits 30 and the output buffer circuits 40. The internal logic circuit 20 is connected through those buffer circuits 30 and 40 with the input terminal pad $P_{in}$ and the output terminal pad $P_{out}$.

In order to execute large-scale digital signal processings and to reduce the power consumption, although not shown in FIGS. 3 and 4, the main part of the internal logic circuit 20 actually includes a number of C-MOS inverters, C-MOS NAND circuits, C-MOS NOR circuits, C-MOS flip-flops and so on formed in accordance with well-known design principles. In order to sufficiently reduce the delay of the operating speeds of those C-MOS circuits, if necessary, it is desired that the output load capacitors of those C-MOS circuits be driven with bipolar transistors by arranging these bipolar transistors at the output portions of those C-MOS circuits in a manner which is known in the art.

The elements composing the internal logic circuit 20 are C-MOS field effect transistors F3 and F4, whereas each of the peripheral buffer circuits 30 and 40 is composed of bipolar transistors Q1, Q2, Q3, Q4, Q5 and Q6. Thus, the bipolar transistors of the peripheral buffer circuits 30 and 40 construct ECL circuits or digital circuits which can have level-convertibility with the ECL circuits. Examples of detailed circuit constructions will be described hereinafter.

Between the internal logic circuit 20 and the peripheral buffer circuits 30 and 40, on the other hand, there are connected, if necessary, other C-MOS buffer circuits 34 and 44, although the invention is not especially limited thereto. The details of these circuits 34 will also be described hereinafter.

Thus, the logic signal at the ECL level can be inputted to the input terminal pad $P_{in}$. This logic input signal at the ECL level is converted into the level of the C-MOS type logic circuit by the input buffer circuit 30 composed of the ECL circuits and is then fed through the other buffer circuits 34 to the internal logic circuit 20.

On the other hand, the output signal of the internal logic circuit 20, which is obtained through the other C-MOS buffers 44, is once converted into the ECL level by the output buffers 40 and is then led out to the output terminal pad $P_{out}$. The output signal thus led out to the output terminal $P_{out}$ can directly drive other ECL circuits.

In the manner described above, the so-called "pin compatibility" for ECL circuits can be provided.

However, it is to be further noted here that the C-MOS type semiconductor integrated circuit can be connected directly to another ECL circuit and that the defects concomitant with the C-MOS type semiconductor integrated circuit shown in FIGS. 1 and 2 can be considerably eliminated.

First of all, the input buffer circuit 30 is composed of the ECL circuits to reduce the problem that the input circuits might be broken electrostatically or by the surge voltage (as was a major concern with the C-MOS input buffer of FIGS. 1 and 2). As a result, no input protection circuit is required so that the rise or fall of the input signal can be prevented from being loosened by said input protection circuit to eliminate one of the causes for delaying the operations. At the same time, the layout area which might otherwise be used for forming the protection circuit is spared.

On the other hand, the internal logic circuit 20 is liable to raise the operating speed because the sizes of the elements, i.e., the C-MOS field effect transistors composing the main part of the circuit 20 are small. The relatively high operating speed of the internal logic circuit 20 can be used as the overall operating speed of the semiconductor integrated circuit 10 by constructing the buffer circuits 30 and 40 of either the ECL circuits having high operating speeds or the digital circuits having the level convertibility with the ECL circuits. By constructing the peripheral buffer circuits 30 and 40 of the ECL circuits or the digital circuits having the level convertibility with the ECL circuits, more specifically, the improvements in the operating speed resulting from the small sizes of the MOS elements composing the C-MOS type internal logic circuit 20 can be effectively enjoyed as they are. As a result, the C-MOS semiconductor integrated circuit shown in FIGS. 3 and 4 can operate at a high speed near the speed of the ECL circuits, and the high-speed characteristics of the ECL circuits will not deteriorate very much even if the semiconductor integrated circuit is used with another ECL circuit. Thus, it is possible to provide the semiconductor integrated circuit 10 which has the advantages of both the ECL circuits and the C-MOS type logic circuits, i.e., the high-speed operation of the ECL circuits and the low power consumption and high integration of the C-MOS type logic circuits.

Figure 5:
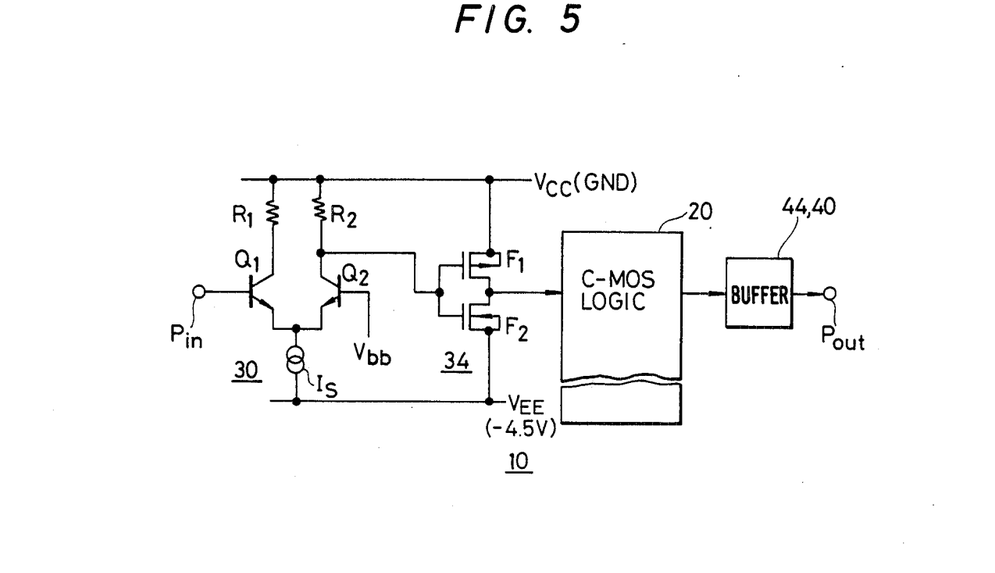
FIG. 5 is a circuit diagram showing one embodiment of an input buffer circuit of the logic semiconductor integrated circuit according to the present invention.

FIG. 5 shows one embodiment of the input buffer circuit 30 and other buffer circuit 34.

First of all, the input buffer circuit 30 is composed of a pair of bipolar transistors Q1 and Q2 and a constant current circuit $I_S$.

The collectors of the individual transistors Q1 and Q2 are connected through series load resistors R1 and R2, respectively, with the positive power source $V_{CC}$ (GND). Moreover, the emitters of the individual transistors Q1 and Q2 are commonly connected through the constant current circuit $I_S$ with the negative power source $V_{EE}$. One transistor Q1 has its base receptive of the input logic signal through the input terminal pad $P_{in}$ from the outside. The other transistor Q2 has its base receptive of a reference potential $V_{bb}$. This reference potential $V_{bb}$ is set at an intermediate level between the two high and low logic levels "H" and "L" which are taken by the input logic signal at the ECL level. As a result, the paired bipolar transistors Q1 and Q2 have their emitters coupled to each other to construct a differential couple, one component of which is adapted to be rendered conductive and driven in response to the input logic signal. As a result, the high-level output at the $V_{CC}$ level (GND) and the low-level output at the ($V_{CC} - R2 \cdot I_S$) level are obtained at the collector of the transistor Q2. In short, the input buffer circuit 30 constructs an ECL circuit for executing the input level conversion. The output of this input buffer circuit 30 of the ECL circuit is extracted from the collector of the other transistor Q2 and is inputted through the other buffer 34 to the C-MOS internal logic circuit 20.

The other buffer 34 is constructed of a C-MOS type inverter which is composed of a p-channel type MOS field effect transistor F1 and an n-channel MOS field effect transistor F2. The C-MOS type inverter thus composed takes its input threshold value at an intermediate level between the power source levels $V_{CC}$ and $V_{EE}$ in accordance with the ratios W/L of the widths W to the lengths L of the individual channels of the paired MOS field effect transistors F1 and F2 composing the C-MOS type inverter.

Moreover, it is very important that the input threshold value of that C-MOS type inverter 34 is set between the level $V_{CC}$ and the level ($V_{CC} - R2 \cdot I_S$) by setting the ratio W/L of the two transistors F1 and F2.

Figure 6:
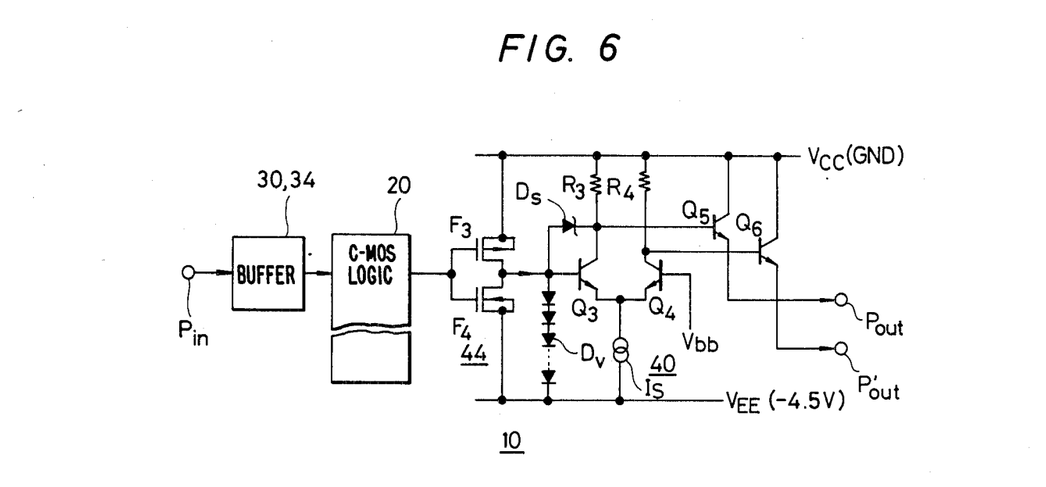
FIG. 6 is a circuit diagram showing one embodiment of an output buffer circuit of the logic semiconductor integrated circuit according to the present invention.

FIG. 6 shows one embodiment of the output buffer circuit 40 and other buffer circuit 44.

First of all, the output buffer circuit 40 is composed of a pair of bipolar transistors Q3 and Q4 and a constant current circuit $I_S$.

The collectors of the individual transistors Q3 and Q4 are connected through series load resistors R3 and R4, respectively, with the positive power source $V_{CC}$. Moreover, the emitters of the individual transistors Q3 and Q4 are commonly connected through the constant current circuit $I_S$ with the negative power source $V_{EE}$. One transistor Q3 has its base receptive of the output logic signal at the CMOS level through the other buffer 44 from the internal logic circuit 20. The other transistor Q4 has its base receptive of a reference potential $V_{bb}$. This reference potential $V_{bb}$ is set at an intermediate level between the two high and low logic levels "H" and "L" which are taken by the output logic signal at the CMOS level. As a result, the paired bipolar transistors Q3 and Q4 have their emitters coupled to each other to construct a differential couple, one component of which is adapted to be rendered conductive and driven in response to the input logic signal. In short, the output buffer circuit 40 constructs an ECL circuit. The output of the output buffer circuit 40 composed of the ECL circuit is extracted through each collector of the individual transistors Q3 and Q4 and is applied to the output terminal $P_{out}$ through an emitter-follower circuit which is composed of bipolar transistors Q5 and Q6.

The high-level output $V_{oH}$ and low-level output $V_{oL}$, which are obtained from the emitter ($P_{out}$) of the transistor Q5, are as follows:

$$V_{oH} = V_{CC} - R3 \cdot I_{BQ5} - V_{BEQ5};$$

and $$V_{oL} = V_{CC} - R3 \cdot I_S - V_{BEQ5}.$$

The high-level output $V_{oH}$ and low-level output $V_{oL}$, which are obtained from the emitter ($P'_{out}$) of the transistor Q6, are as follows:

$$V_{oH} = V_{CC} - R4 \cdot I_{BQ6} - V_{BEQ6};$$

and $$V_{oL} = V_{CC} - R4 \cdot I_S - V_{BEQ6}.$$

It is sufficient that the values of R3, R4, $I_S$ and so on be so set that the high-level and low-level outputs $V_{oH}$ and $V_{oL}$ take $-0.9$ V and $-1.7$ V, respectively.

Thus, the output buffer circuit 40 converts the level of the input signal at the CMOS level to that of the output signal at the ECL level.

The other buffer 44 is constructed of a C-MOS type inverter which is composed of a p-channel type MOS field effect transistor F3 and an n-channel MOS field effect transistor F4. The C-MOS type inverter thus composed is caused, as has been described hereinbefore, to take its input threshold value at an intermediate level between the power source levels $V_{CC}$ and $V_{EE}$ if the ratios W/L of the widths W to the lengths L of the individual channels of the paired MOS field effect transistors composing the C-MOS type inverter are properly set.

Incidentally, in the present embodiment, by connecting a Schottky barrier diode $D_S$ between the base and collector of one transistor Q3 of the ECL circuit, as shown, the transistor Q3 can be prevented from saturating, and this raises the operating speed of the output buffer circuit 40.

Figure 7:
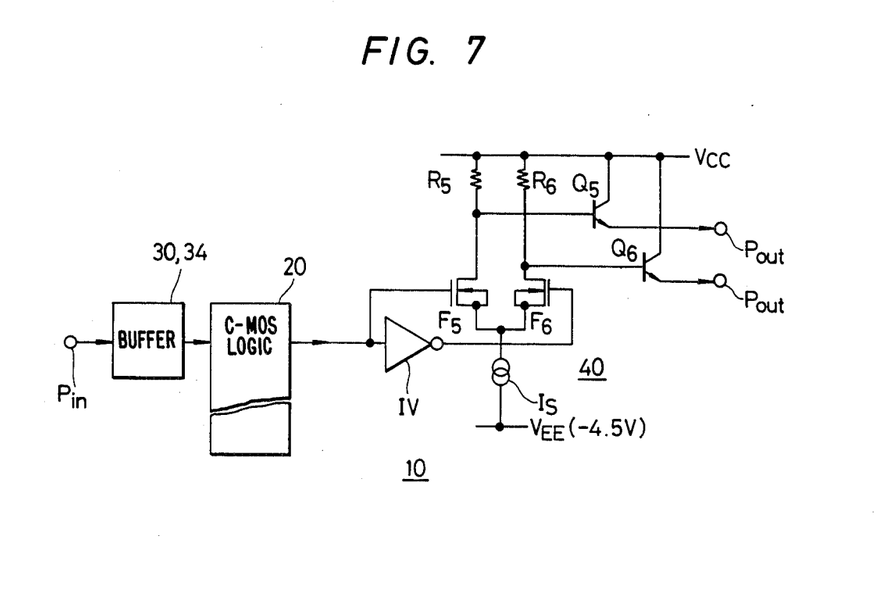
FIG. 7 is a circuit diagram showing another embodiment of the output buffer circuit of the logic semiconductor integrated circuit according to the present invention.

FIG. 7 shows another embodiment of the output buffer circuit 40 described above.

Here, the output buffer circuit 40 is composed of a pair of MOS field effect transistors F5 and F6.

The drains of the individual transistors F5 and F6 are connected through series load resistors R5 and R6, respectively, with the positive power source $V_{CC}$. Moreover, the sources of the individual transistors F5 and F6 are commonly connected through the constant current circuit $I_S$ with the negative power source $V_{EE}$. One transistor F5 has its base which may directly receive the output logic signal from the internal logic circuit 20. The other transistor F6 has its gate receptive of the output logic signal from the internal logic circuit 20 after its phase has been inverted by the C-MOS inverter IV. As a result, the paired MOS field effect transistors F5 and F6 construct a differential couple which is complementarily rendered conductive and driven in response to the input logic signal. The inverted and non-inverted logic outputs are extracted from the drains of the MOS field effect transistors F5 and F6. These logic outputs are respectively inputted to the bases of the bipolar transistors Q5 and Q6 which construct together the emitter-follower circuit. The logic outputs are led therefrom as the outputs at the ECL level to the output terminal pad $P_{out}$.

In this case, the level conversion between the output level of the internal logic circuit 20 and the output terminal pad $P_{out}$ is conducted at the portion containing the paired MOS field effect transistors F5 and F6, the resistors R5 and R6, the transistors Q5 and Q6 and the constant current circuit $I_S$. The differential drive of the paired MOS field effect transistors F5 and F6 is conducted at the output level of the internal logic circuit 20. In other words, the differential output level is set at the output of the ECL level by selecting the values of the series load resistors R5 and R6 and the current value of the constant current circuit $I_S$. In short, here, the output buffer circuit 40 has a function of the level conversion.

Figure 8:
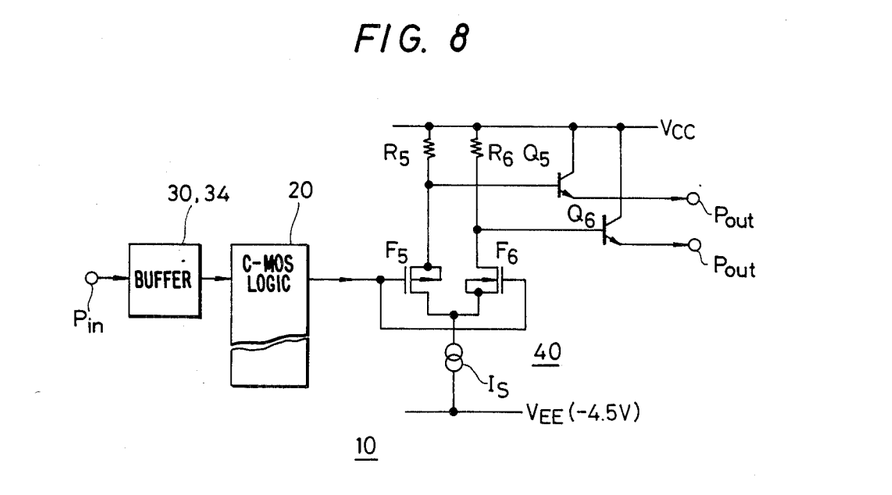
FIG. 8 is a circuit diagram showing still another embodiment of the output buffer circuit of the logic semiconductor integrated circuit according to the present invention.

FIG. 8 shows still another embodiment of the output buffer circuit 40.

Here, the output buffer circuit 40 is composed of the p-channel MOS field effect transistor F5 and the n-channel MOS field effect transistor F6. In other words, the output buffer circuit 40 is composed of the field effect transistors having characteristics complementary to each other.

The individual transistors F5 and F6 are connected through the series load resistors R5 and R6, respectively, with the positive power source $V_{CC}$. Moreover, the individual transistors F5 and F6 are commonly connected through the constant current circuit $I_S$ with the negative power source $V_{EE}$. The individual transistors F5 and F6 have their gates which may directly receive the output logic signal of the internal logic circuit 20. Thus, the paired MOS field effect transistors F5 and F6 construct a differential couple which is complementarily rendered conductive and driven in response to the input logic signal. The inverted and non-inverted logic outputs are extracted from the MOS field effect transistors F5 and F6. These logic outputs are respectively inputted to the bases of the bipolar transistors Q5 and Q6 constructing the emitter-follower circuit. The logic outputs are led out therefrom as the output at the ECL level to the output terminal pad $P_{out}$.

In this case, the level conversion between the output level of the internal logic circuit 20 and the output terminal pad $P_{out}$ is conducted like the case of the embodiment shown in FIG. 7. Specifically, the differential output level is set at the ECL level by selecting the values of the series load resistors R5 and R6 and the current value of the constant current circuit $I_S$. In other words, the output buffer circuit 40 in this case also has a function of the level conversion. According to the present embodiment, on the other hand, the two transistors F5 and F6 can be differentially driven without the need for generating any two-phase signal by the use of an inverter. In this respect the arrangement of FIG. 8 is different from the embodiment shown in FIG. 7, thanks to the use of the p-channel and n-channel MOS field effect transistors having characteristics which are complementary to each other. As a result, the drive timings of the two transistors F5 and F6 can be prevented from any discrepancy and this serves to raise the operating speed.

Figure 9:
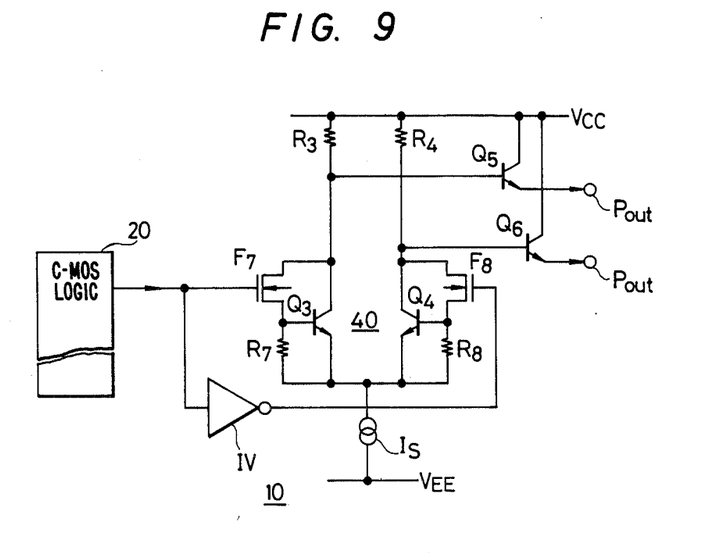
FIG. 9 is a circuit diagram showing a further embodiment of the output buffer circuit of the logic semiconductor integrated circuit according to the present invention.

FIG. 9 shows a further embodiment of the output buffer circuit 40.

In the output buffer circuit 40 shown in FIG. 9, there is constructed a differential circuit in which the bipolar transistors Q3 and Q4 and MOS field effect transistors F7 and F8 are combined.

First of all, the series load resistors R3 and R4 are connected between the collectors of the bipolar transistors Q3 and Q4 and the positive power source $V_{CC}$, and the constant current circuit $I_S$ is connected in series between the common emitter of the bipolar transistors Q3 and Q4 and the negative power source $V_{EE}$. Moreover, the drains and sources of the MOS field effect transistors F7 and F8 are connected between the collectors and bases of the individual transistors Q3 and Q4, respectively, so that the base input currents are given from the field effect transistors F7 and F8.

The MOS field effect transistors F7 and F8 have their drains connected with the collectors of the bipolar transistors Q3 and Q4 and their sources connected with the bases of the bipolar transistors Q3 and Q4. Moreover, one MOS field effect transistor F7 has its gate which may directly receive the logic output of the internal logic circuit 20. On the other hand, the other MOS field effect transistor F8 has its gate receptive of the logic output which is prepared by inverting the phase of the logic output of the internal logic circuit 20 by the action of the C-MOS inverter IV. As a result, the two bipolar transistors Q3 and Q4 are complementarily driven in response to the output of the internal logic circuit 20. Moreover, the outputs by the complementary drive are extracted from the collectors of the bipolar transistors Q3 and Q4 and are applied to the output terminal pad $P_{out}$ through the bipolar transistors Q5 and Q6 constructing the emitter-follower circuit.

In the manner described above, the output of the internal logic circuit 20 is led out at the ECL level through the output buffer circuit 40.

The level conversion in the circuit of the present embodiment belongs to the function of the output buffer circuit 40. The input threshold level of this output buffer circuit 40 is set in accordance with the output level of the internal logic circuit 20. On the other hand, the output level of the output buffer circuit 40 can be set at the ECL level like the case of the embodiment shown in FIG. 7 in dependence upon the values of the series load resistors R3 and R4 and the constant current circuit $I_S$. In the embodiment of FIG. 9, moreover, the base input threshold values of the bipolar transistors Q3 and Q4 can be adjusted by connecting the resistors R7 and R8 in parallel between the bases and emitters of the bipolar transistors Q3 and Q4, respectively.

Incidentally, in the circuit of the present embodiment, the output buffer circuit 40 can be given the multi-input logic function, as will be described hereinafter.

Figure 10:
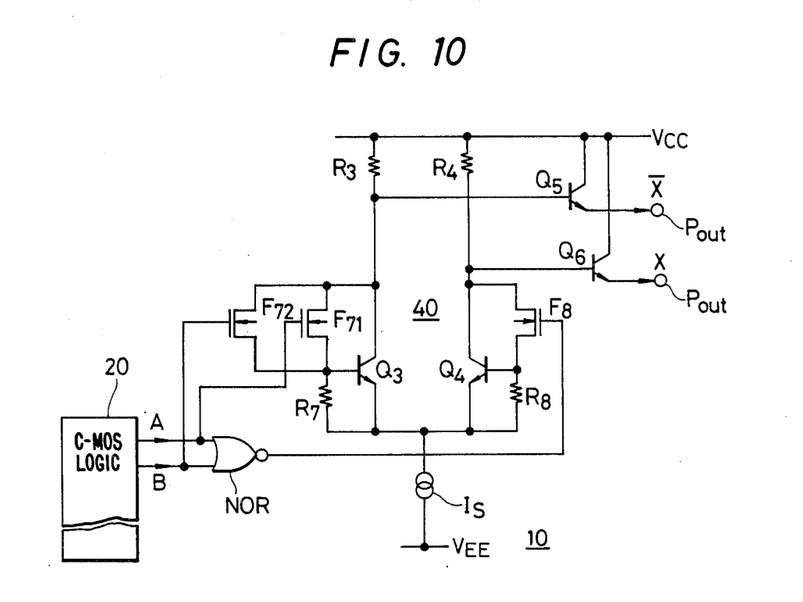
FIG. 10 is a circuit diagram showing an embodiment in which the output buffer circuit of the logic semiconductor integrated circuit according to the present invention is given a multi-input logic function.

FIG. 10 shows a further embodiment of the output buffer circuit 40.

The output buffer circuit 40 shown in FIG. 10 is constructed by imparting the function of a multi-input logic circuit to the output buffer circuit 40 shown in FIG. 9. The basic construction is substantially identical to that of FIG. 9.

The differences from the construction of FIG. 9 are in the following points. A first difference is that the base current of one bipolar transistor Q3 to be complementarily driven is given from two MOS field effect transistors F71 and F72 having their drains and sources commonly connected. Moreover, the MOS field effect transistor F8 connected with the other bipolar transistor Q4 has its gate receptive of the output of a two-input NOR circuit NOR in place of the inverter IV of FIG. 9. This NOR is of the C-MOS type.

Here, two logic signals A and B outputted from the internal logic circuit 20 are distributed among and inputted to the individual gates of the two MOS field effect transistors F71 and F72 and the logic input of the NOR. When at least one of the two logic outputs A and B of the internal logic circuit 20 is raised to the "H" level, one bipolar transistor Q3 is rendered conductive and driven whereas the other bipolar transistor Q4 is rendered nonconductive. These conductive and nonconductive states are respectively outputted to the output terminal pad P$_{out}$ through the emitter-follower circuit composed of the bipolar transistors Q5 and Q6. At this time, the NOR $\overline{X}=\overline{A+B}$ of the two logic signals A and B is outputted as one logic output $\overline{X}$, whereas the OR X=A+B is outputted as the other logic output X. In short, the output buffer circuit 40 functions as the two-input NOR, too.

If the output buffer circuit 40 is given the function as the multi-input logic circuit, the degree of freedom of designing the semiconductor integrated circuit 10 is raised to provide an advantage that the function can be changed, while leaving the internal logic circuit 20 as it is, in the gate array called the "master slice".

Figure 11:
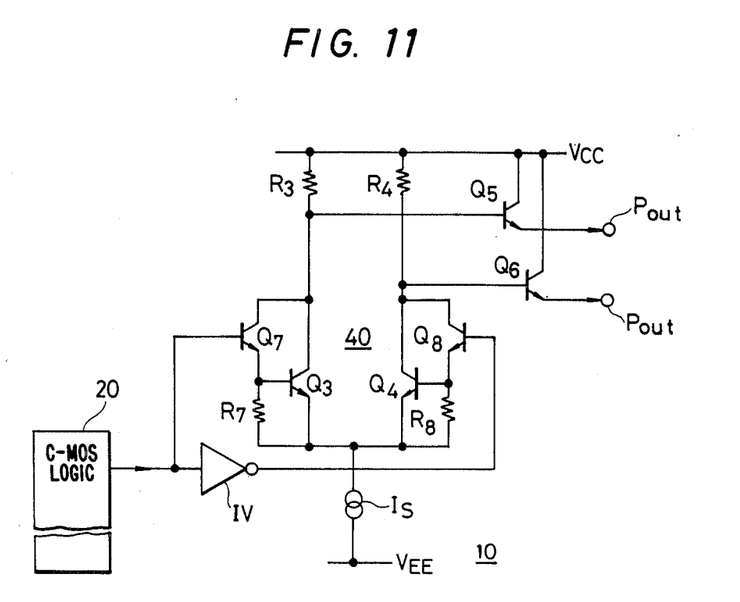
FIG. 11 is a circuit diagram showing a further embodiment of the output buffer circuit of the logic semiconductor integrated circuit according to the present invention.

As shown in FIG. 11, moreover, the circuit as shown in FIG. 9 can also be constructed by using bipolar transistors Q7—Q3 and Q8—Q4 which are connected in the Darlington connection.

In the output buffer circuit 40 shown in FIG. 11, first of all, the series load resistors R3 and R4 are connected between the collectors of the Darlington-connected bipolar transistors Q7—Q3 and Q8—Q4 and the positive power source V$_{CC}$, and the constant current circuit I$_S$ is connected in series between the common emitter of the same bipolar transistors and the negative power source V$_{EE}$.

The logic output of the internal logic circuit 20 is inputted directly to the one Darlington transistor arrangement Q7—Q3. To the other Darlington transistor arrangement Q8—Q4, on the other hand, there is inputted the logic output which is prepared by inverting the phase of the logic output of the internal logic circuit 20 by means of the C-MOS type inverter IV. As a result, the two sets of Darlington transistors Q7—Q3 and Q8—Q4 are complementarily driven in response to the output of the internal logic circuit 20. Moreover, the output resulting from the complementary drive is led out to the output terminal pad P$_{out}$ through the bipolar transistor Q5 and Q6 composing the emitter-follower circuit.

In the manner described above, the output of the internal logic circuit 20 is led out at the ECL level through the output buffer circuit 40.

Even in the case of the circuit of the present embodiment of FIG. 11, the output buffer circuit 40 also has a function of the level conversion. The input threshold level of the output buffer circuit 40 is set in accordance with the output level of the internal logic circuit 20. On the other hand, the output level of the output buffer circuit 40 can be set at the ECL level by the values of the series load resistors R3 and R4 and the current value of the constant current circuit I$_S$. By connecting resistors R7 and R8 in parallel between the bases and emitters of the bipolar transistors Q3 and Q4, respectively, the base input threshold values of the bipolar transistors Q3 and Q4 can be adjusted. Incidentally, even in the circuit of the present embodiment, the output buffer circuit 40 can be given the multi-input logic function, as will be described hereinafter.

Figure 12:
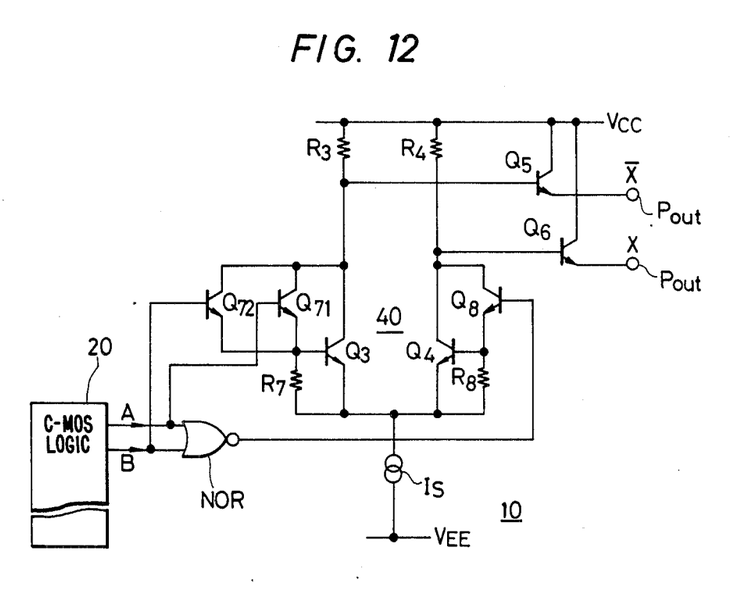
FIG. 12 is a circuit diagram showing another embodiment in which the output buffer circuit of the logic semiconductor integrated circuit according to the present invention is given a multi-input logic function.

FIG. 12 shows a further embodiment of the output buffer circuit 40.

The output buffer circuit 40 shown in FIG. 12 is constructed by imparting the function as a multi-input logic circuit to the output buffer circuit 40 shown in FIG. 11. The basic construction is substantially identical to that of FIG. 11.

The differences from the construction of FIG. 11 are directed to the following points. A first difference is that two parallel-connected bipolar transistors Q71 and Q72 are connected in the Darlington form with the base of one bipolar transistor Q2 to be complementarily driven. Moreover, the bipolar transistor Q8 which is Darlington-connected with the other bipolar transistor Q4 has its base receptive of the output of the two-input NOR circuit NOR in place of the inverter IV of FIG. 11. This NOR is of the C-MOS type.

Here, the two logic signals A and B outputted from the internal logic circuit 20 are distributed among and inputted to the individual base inputs of the two Darlington transistors Q71/Q72—Q3 and Q8—Q4 and the logic input of the NOR.

When at least one of the two logic outputs A and B from the internal logic circuit 20 is raised to the "H" level, one bipolar transistor Q3 is rendered conductive and driven whereas the other bipolar transistor Q4 is rendered nonconductive. These conductive and nonconductive states are respectively outputted to the output terminal pad P$_{out}$ through the emitter-follower circuit composed of the bipolar transistors Q5 and Q6. At this time, the NOR $\overline{X}=\overline{A+B}$ of the two logic signals A and B is outputted as one logic output $\overline{X}$, whereas the OR X=A+B is outputted as the other logic output X. In short, the output buffer circuit 40 functions as the two-input NOR, too.

Figure 13:
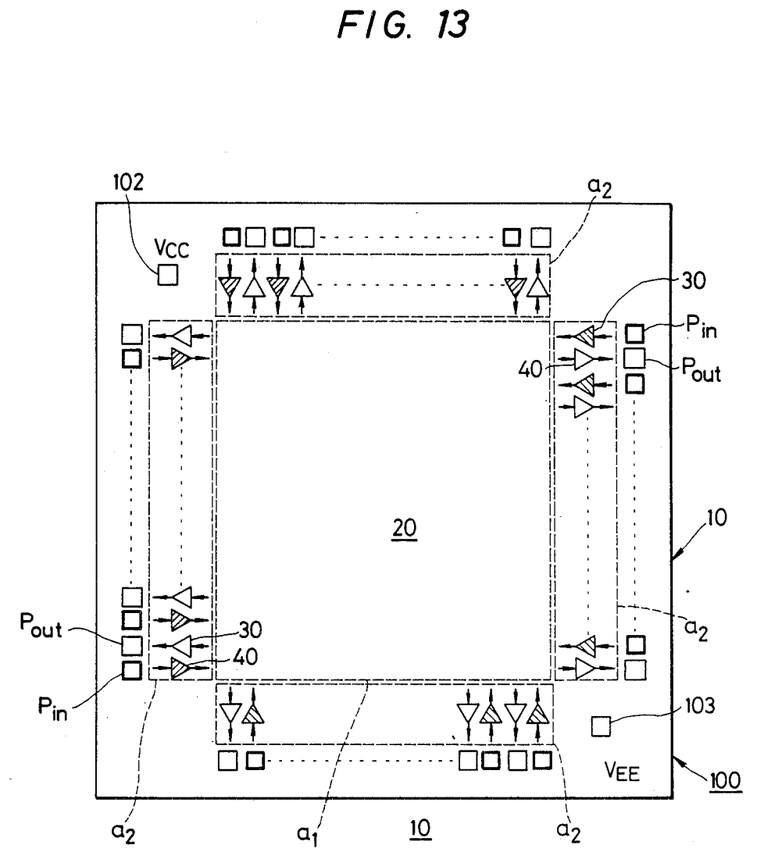
FIG. 13 is a top plan view showing one example of a semiconductor chip which is formed with the logic semiconductor integrated circuit according to the embodiments of the present invention.

FIG. 13 shows one example of the layout state of each circuit block in the surface of a semiconductor chip 100 of the semiconductor integrated circuit 10 according to the embodiment of the present invention.

The central portion of the semiconductor chip 100 is assigned to a block region a$_1$ in which the internal logic circuit 20 composed of the C-MOS circuits is to be constructed. On the other hand, the peripheral portion of the semiconductor chip 100 is assigned to a block region a$_2$ in which the input buffer circuits 30 and the output buffer circuits 40 are to be constructed. Moreover, the semiconductor chip 100 is formed outside of the peripheral block region a$_2$ with a number of the input terminal pads P$_{in}$ and output terminal pads P$_{out}$.

The input buffer circuits 30 and the output buffer circuits 40 are alternately arrayed in the peripheral block region a$_2$. Moreover, the individual buffer circuits 30 and 40 and the individual terminal pads P$_{in}$ and P$_{out}$ are arranged to make individual pairs. The input terminal pads P$_{in}$ and the output terminal pads P$_{out}$ are individually used as bonding pads. The semiconductor chip 100 is further provided at its corners with a bonding pad 102 for supplying the power source V$_{CC}$ and a bonding pad 104 for supplying the power source V$_{EE}$.

Figure 14:
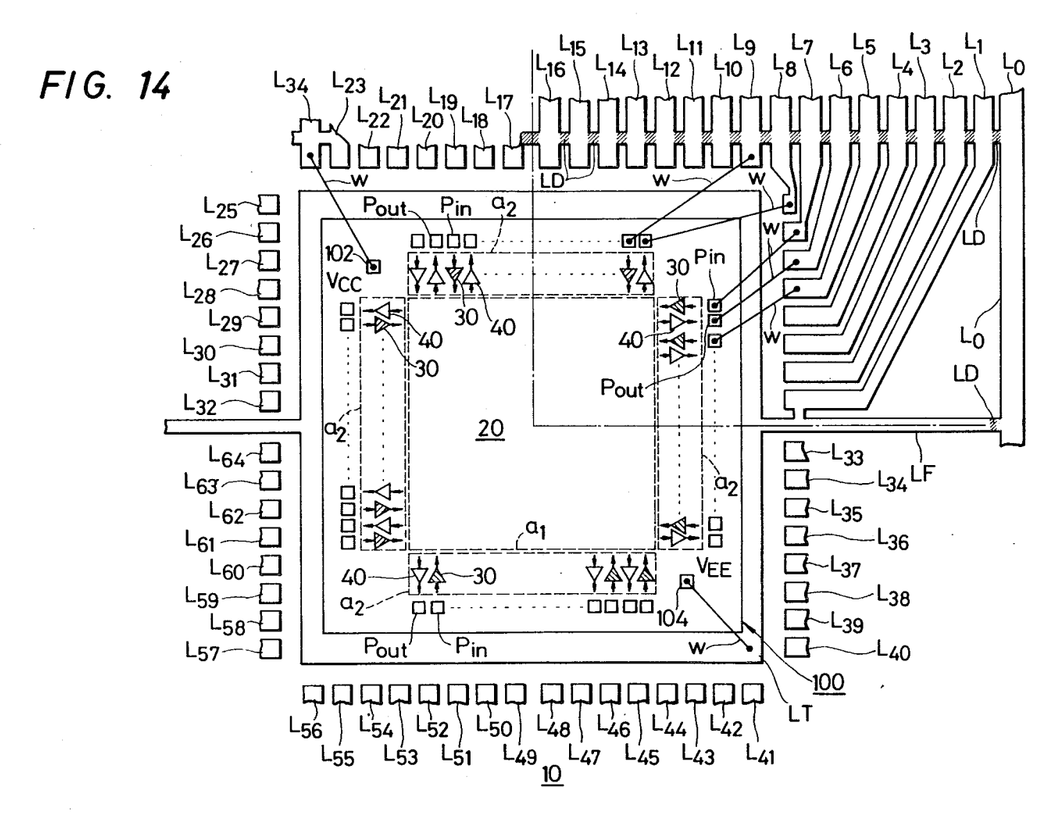
FIG. 14 is a top plan view showing one example of the state in which the semiconductor chip formed with the logic semiconductor integrated circuit according to the embodiments of the present invention is connected with a lead frame.

The semiconductor chip 100 is connected, as shown in FIG. 14, such that its back is held in physical and electrical contact with the surface of the tab lead LT of a metal lead frame LF.

The lead frame LF is made by punching a thin metal plate into a predetermined shape and is integrally formed with the tab lead LT, lead portions L1 to L64, a frame L$_o$, and hatched dam portions LD.

The terminal pads P$_{in}$ and P$_{out}$ and the power source bonding pad 102 are connected with the lead portions L1 to L64 by means of bonding wires w made of gold. Likewise, the bonding pad 104 for supplying the power source V$_{EE}$ is connected with the tab lead LT.

After the wiring operation using the wires w, the semiconductor chip 100 and the lead frame LF are fitted in a mold so that they may be sealed with a resin. Then, the resin molding operation is conducted by injecting a liquid resin into the inside of the dam portions LD of the lead frame LF. During this operation, the dam portions LD block the flow-out of the resin.

When the molding resin solidifies, the semiconductor chip 100 and the lead frame LF are extracted from the mold, and the dam portions LD are cut off to electrically separate the individual lead portions L1 to L64.

Figure 15:
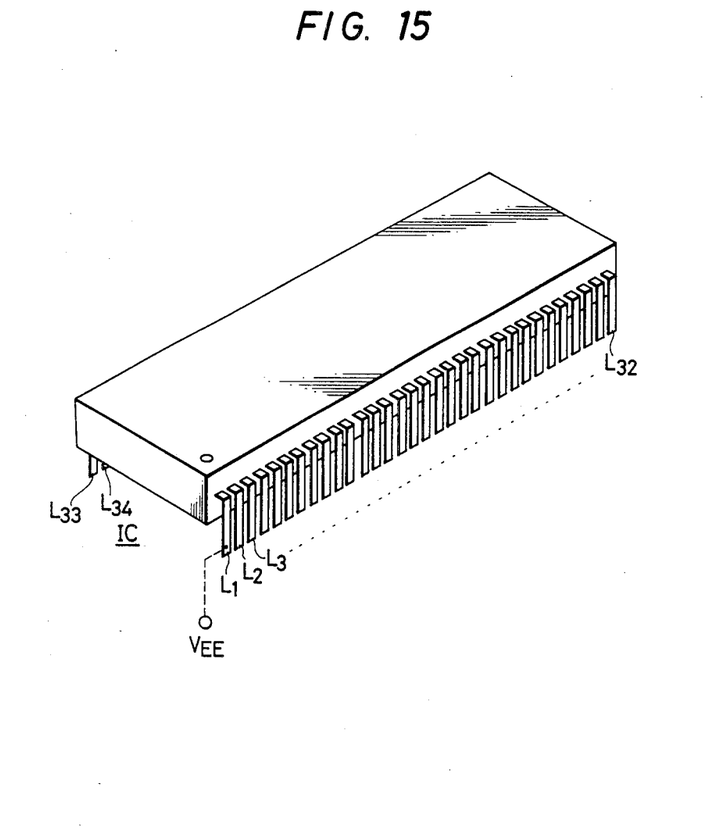
FIG. 15 is a perspective view showing the state in which the semiconductor chip is packaged.

After that, by bending the individual lead portions L1 to L64 downward, there is fabricated a semiconductor integrated circuit IC which has such an appearance and a construction as are shown in FIG. 15.

In this case, the resin-sealed semiconductor chip 100 has its peripheral buffer circuits 30 and 40 taking the ECL input level or the ECL output level so that its electric characteristics, as viewed from the outside, are absolutely the same as those of the ECL circuits. As a result, the semiconductor chip 100 can be connected as it is with the ECL circuits to construct a digital circuit system. However, the internal logic circuit 20 of the digital circuit system is liable to raise the integration density because it is composed of the C-MOS circuits, as has been described hereinbefore. At the same time, the power consumption is reduced so that the internal heat liberation is made far lower than that of the semiconductor integrated circuit which has its internal logic circuit composed of ECL circuits. As a result, the package structure is simply made without any use of a special heat sink.

As a result that the peripheral buffer circuits 30 and 40 are composed of the bipolar transistors at least their sides to be connected with the outside, moreover, it is possible to omit the input protection circuit which has been indispensable for the MOS type logic semiconductor integrated circuit. Still moreover, the inputting and outputting operations of the logic signals are conducted with the low impedances of the ECL circuits at the high speeds so that they appear to the outside without affecting the operating speed of the internal logic circuit 20 composed of the C-MOS circuits. As a result, it is possible to provide the semiconductor integrated circuit which has the advantages of both the C-MOS logic circuit and the ECL circuits.

The circuit function required for a relatively high integration density such as an RAM (i.e., random access memory) or a gate array is especially suitable for the function of the internal logic circuit 20.

The following advantageous effects can be attained according to the embodiments thus far described.

(1) Since the main part of the internal logic circuit 20 is composed of the C-MOS elements whereas the peripheral buffer circuits are composed of the bipolar transistors, there can be attained an effect that the function of the logic circuit composed of the C-MOS elements can be equivalently used as that of the ECL circuit.

(2) Since the main part of the internal logic circuit 20 is composed of the C-MOS elements whereas the peripheral buffer circuits are constructed of either the ECL circuits or the bipolar type digital circuits having level-convertibility with the ECL circuits composed of the bipolar transistors, there can be attained an effect that the semiconductor integrated circuit according to the present invention and the other ECL semiconductor integrated circuit can be directly connected and used.

(3) Since the main part of the internal logic circuit 20 is composed of the C-MOS elements whereas the peripheral buffer circuits are constructed of either the ECL circuits or the bipolar type digital circuits having level-convertibility with the ECL circuits composed of the bipolar transistors, there can be attained an effect that it is possible to achieve both the reduction in the power consumption and the improvement in the operating speed.

(4) Since the main part of the internal logic circuit 20 is composed of the C-MOS elements whereas the peripheral buffer circuits are constructed of either the ECL circuits or the bipolar type digital circuits having level-convertibility with the ECL circuits composed of the bipolar transistors, there can be attained an effect that it is possible to construct the equivalent ECL type logic semiconductor integrated circuit having high integration density.

(5) Since the main part of the internal logic circuit 20 is composed of the C-MOS elements whereas the peripheral buffer circuits are constructed of either the ECL circuits or the bipolar type digital circuits having level-convertibility convertibility with the ECL circuits composed of the bipolar transistors, there can be attained an effect that it is possible to construct an equivalent ECL type logic semiconductor integrated circuit which has high integration density and low heat liberation.

(6) Since the main part of the internal logic circuit 20 is composed of the C-MOS elements whereas the peripheral buffer circuits are constructed of either the ECL circuits or the bipolar type digital circuits having level-convertibility with the ECL circuits composed of the bipolar transistors, there can be attained an effect that the input protection circuit can be dispensed with.

(7) Since the main part of the internal logic circuit 20 is composed of the C-MOS elements whereas the peripheral buffer circuits are constructed of either the ECL circuits or the bipolar type digital circuits having level-convertibility with the ECL circuits composed of the bipolar transistors, there can be attained an effect that the operating speed of the C-MOS type internal logic circuit can appear in the outside without being deteriorated in the least.

From the foregoing items (1) to (7), moreover, there can be attained a multiplied effect that it is possible to provide the logic semiconductor integrated circuit which has the advantages of both the C-MOS type semiconductor integrated circuit and the ECL circuits.

The present invention conceived by me has been specifically described hereinbefore in connection with the embodiments thereof. However, the present invention should not be limited to those foregoing embodiments but can naturally be modified in various manners without departing from the gist thereof. For example, the bipolar transistors Q1 to Q8 may be of the type formed with Schottky diodes. On the other hand, the internal logic circuit 20 may be constructed of n-MOS or p-MOS elements, for example, in place of the C-MOS elements.

The description thus far made is directed mainly to the case in which the present invention conceived by me is applied to the technique concerning the peripheral interface of the C-MOS type logic semiconductor integrated circuit belonging to the field of application providing the background of the present invention. However, the present invention should not be limited thereto but can be applied to the circuit technique, for example, in case the internal logic circuit partially contains other MIS type elements. The present invention can be applied at least under the condition where the input and output of the internal logic circuit composed of the C-MOS elements are at the ECL level.

I claim:

1. A semiconductor integrated circuit comprising:
   (1) an internal logic block including a plurality of C-MOS elements;
   (2) an input terminal;
   (3) an output buffer circuit connected between said internal logic circuit and said output terminal;
   (4) a first power source terminal receptive of a ground potential as a first power source voltage; and
   (5) a second power source terminal receptive of a negative voltage as a second power source voltage, wherein said internal logic circuit and said output buffer circuit are operative with said negative voltage, wherein said output buffer circuit has an input terminal receptive of an output signal of said internal logic circuit, wherein said output buffer circuit includes means for generating an output signal at an ECL level at said output terminal in response to receiving the output signal of said internal logic circuit, wherein said means of said output buffer circuit includes an emitter-follower transistor having its emitter connected with said output terminal and its base responsive to the output signal of said internal logic circuit as well as a semiconductor amplifying element having its input electrode responsive to the output signal of said internal logic circuit and its output electrode connected through a load resistor with said ground potential so that the base of said emitter-follower transistor is driven by the signal of said output electrode of said semiconductor amplifying element, wherein said means of said output buffer circuit further comprises a second emitter-follower transistor having its emitter coupled with a second output terminal and its base coupled with a second semiconductor amplifying element, wherein said second semiconductor amplifying element is differentially coupled with said first semiconductor amplifying element, and wherein said first and second semiconductor amplifying elements comprise a pair of MOS transistors.

2. A semiconductor integrated circuit according to claim 1, wherein said MOS transistors are of the same channel conductivity type.

3. A semiconductor integrated circuit according to claim 1, wherein said MOS transistors are of opposite channel conductiveity type.

4. A semiconductor integrated circuit comprising:
   (1) an internal logic block including a plurality of C-MOS elements;
   (2) an output terminal;
   (3) an output buffer circuit connected between said internal logic circuit and said output terminal;
   (4) a first power source terminal receptive of a ground potential as a first power source voltage; and
   (5) a second power source terminal receptive of a negative voltage as a second power source voltage, wherein said internal logic circuit and said output buffer circuit are operative with said negative voltage, wherein said output buffer circuit has an input terminal receptive of an output signal of said internal logic circuit, wherein said output buffer circuit includes means for generating an output signal at an ECL level at said output terminal in response to receiving the output signal of said internal logic circuit, wherein said means of said output buffer circuit includes an emitter-follower transistor having its emitter connected with said output terminal and its base responsive to the output signal of said internal logic circuit as well as a semiconductor amplifying element having its input electrode responsive to the output signal of said internal logic circuit and its output electrode connected through a load resistor with said ground potential so that the base of said emitter-follower transistor is driven by the signal of said output electrode of said semiconductor amplifying element, wherein said means of said output buffer circuit further comprises a second emitter-follower transistor having its emitter coupled with a second output terminal and its base coupled with a second semiconductor amplifying element, wherein said second semiconductor amplifying element is differentially coupled with said first semiconductor amplifying element, wherein said internal logic circuit provides first and second output signals to said output buffer circuit, and wherein said output buffer circuit includes a first switching element coupled between said first internal logic output signal and said first semiconductor amplifying element and a second switching element coupled between said second internal logic output signal and said first semiconductor amplifying element.

5. A semiconductor integrated circuit according to claim 4, wherein said first and second switching elements are MOS transistors.

6. A semiconductor integrated circuit according to claim 4, wherein said output buffer circuit further includes a NOR circuit and a third switching element, wherein said first and second internal logic output signals drive inputs of said NOR circuit, and wherein said third switching element of an MOS transistor is coupled between an output of said NOR circuit and said second semiconductor amplifying element.

7. A semiconductor integrated circuit comprising:
   (1) an internal logic block including a plurality of C-MOS elements;
   (2) an output terminal;
   (3) an output buffer circuit connected between said internal logic circuit and said output terminal;
   (4) a first power source terminal receptive of a ground potential as a first power source voltage; and
   (5) a second power source terminal receptive of a negative voltage as a second power source voltage, wherein said internal logic circuit and said output buffer circuit are operative with said negative voltage, wherein said output buffer circuit has an input terminal receptive of an output signal of said internal logic circuit, wherein said output buffer circuit includes means for generating an output signal at an ECL level at said output terminal in response to receiving the output signal of said internal logic circuit, wherein said means of said output buffer circuit includes an emitter-follower transistor having its emitter connected with said output terminal and its base responsive to the output signal of said internal logic circuit as well as a semiconductor amplifying element having its input electrode responsive to the output signal of said internal logic circuit and its output electrode connected through a load resistor with said ground potential so that the base of said emitter-follower transistor is driven by the signal of said output electrode of said semiconductor amplifying element, wherein said means of said output buffer circuit further comprises a second emitter-follower transistor having its emitter coupled with a second output terminal and its base coupled with a second semiconductor amplifying element, wherein said second semiconductor amplifying element is differentially coupled with said first semiconductor amplifying element, wherein said first and second semiconductor amplifying elements comprise a pair of emitter-coupled bipolar transistors, wherein said output buffer circuit further includes first and second switching elements of MOS transistors as well as an inverter circuit, wherein said first switching element is responsive to the output signal of said internal logic circuit and coupled between said input electrode and said output electrode of said first semiconductor amplifying element, wherein an input terminal of said inverter circuit is responsive to the output signal of said internal logic circuit, and wherein said second switching element is responsive to an output signal of said inverter circuit and coupled between an input electrode and an output electrode of said second semiconductor amplifying element.

8. A semiconductor integrated circuit according to claim 1, wherein said second semiconductor amplifying element is responsive to a reference voltage.

9. A semiconductor integrated circuit according to claim 1, wherein said pair of MOS transistors are source-coupled to one another.

10. A semiconductor integrated circuit according to claim 8, wherein said pair of MOS transistors are source-coupled to one another.

11. A semiconductor integrated circuit according to claim 1, wherein a drain of one of said pair of MOS transistors is coupled to a source of the other of said pair of MOS transistors.

12. A semiconductor integrated circuit according to claim 8, wherein a drain of one of said pair of MOS transistors is coupled to a source of the other of said pair of MOS transistors.

13. A semiconductor integrated circuit according to claim 4, wherein said first and second semiconductor elements comprise a pair of emitter-coupled bipolar transistors.

14. A semiconductor integrated circuit according to claim 4, wherein said second semiconductor element is responsive to a reference source.

* * * * *